US008415203B2

(12) United States Patent
Burch et al.

(10) Patent No.: US 8,415,203 B2
(45) Date of Patent: Apr. 9, 2013

(54) METHOD OF FORMING A SEMICONDUCTOR PACKAGE INCLUDING TWO DEVICES

(75) Inventors: Kenneth R. Burch, Austin, TX (US); Marc A. Mangrum, Austin, TX (US); William H. Lytle, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 420 days.

(21) Appl. No.: 12/240,509

(22) Filed: Sep. 29, 2008

(65) Prior Publication Data
US 2010/0078808 A1 Apr. 1, 2010

(51) Int. Cl.
*H01L 21/00* (2006.01)

(52) U.S. Cl.
USPC .................. 438/110; 438/106; 257/E23.169

(58) Field of Classification Search .................. 257/723, 257/E23.169; 438/106, 110, 112, 113, 127
See application file for complete search history.

(56) References Cited

U.S. PATENT DOCUMENTS

| | | | |
|---|---|---|---|
| 3,858,150 A | 12/1974 | Gurtler et al. | |
| 4,317,126 A | 2/1982 | Gragg, Jr. | |
| 4,617,606 A | 10/1986 | Shak et al. | |
| 5,353,498 A | 10/1994 | Fillion et al. | |
| 5,635,010 A | 6/1997 | Pepe et al. | |
| 5,841,193 A * | 11/1998 | Eichelberger | 257/723 |
| 5,866,952 A | 2/1999 | Wojnarowski et al. | |
| 5,889,211 A | 3/1999 | Maudie et al. | |
| 5,991,185 A | 11/1999 | Hachiya | |
| 6,310,606 B1 | 10/2001 | Armstrong | |
| 6,407,456 B1 | 6/2002 | Ball | |
| 6,772,510 B1 | 8/2004 | Corisis | |
| 6,806,593 B2 | 10/2004 | Tai et al. | |
| 6,838,776 B2 | 1/2005 | Leal et al. | |
| 6,924,551 B2 | 8/2005 | Rumer et al. | |
| 6,958,261 B2 | 10/2005 | Chow et al. | |
| 6,964,889 B2 | 11/2005 | Ma et al. | |
| 7,009,124 B2 | 3/2006 | Chen et al. | |
| 7,045,868 B2 | 5/2006 | Ding et al. | |
| 7,074,647 B2 | 7/2006 | Owens et al. | |
| 7,111,149 B2 | 9/2006 | Eilert | |
| 7,166,495 B2 | 1/2007 | Ball | |
| 7,189,596 B1 | 3/2007 | Mu et al. | |
| 7,202,140 B1 | 4/2007 | Ang et al. | |
| 7,241,641 B2 | 7/2007 | Savastiouk et al. | |
| 7,425,464 B2 | 9/2008 | Fay et al. | |
| 2001/0001292 A1 * | 5/2001 | Bertin et al. | 438/107 |

(Continued)

OTHER PUBLICATIONS

U.S. Appl. No. 12/240,513, filed Sep. 29, 2008, entitled Method of Forming a Package with Exposed Component Surfaces first-named inventor, Lytle, William H.

(Continued)

*Primary Examiner* — Thanh V Pham
*Assistant Examiner* — Duy T Nguyen

(57) ABSTRACT

A method of forming a semiconductor package includes providing a carrier, attaching a first surface of a first device on the carrier, wherein the first surface comprises a first active surface of the first device, and attaching a second surface of a second device on the carrier. In one embodiment, the second surface is opposite a third surface of the second semiconductor die and the third surface comprises a second active surface. A first insulating material can be formed between the first device and the second device.

21 Claims, 2 Drawing Sheets

U.S. PATENT DOCUMENTS

| | | | |
|---|---|---|---|
| 2004/0090756 A1* | 5/2004 | Ho et al. | 361/767 |
| 2004/0195700 A1* | 10/2004 | Liu | 257/780 |
| 2005/0029644 A1* | 2/2005 | Ho et al. | 257/686 |
| 2005/0062173 A1 | 3/2005 | Vu et al. | |
| 2006/0001152 A1* | 1/2006 | Hu | 257/707 |
| 2006/0118933 A1 | 6/2006 | Haba | |
| 2006/0125080 A1* | 6/2006 | Hsu | 257/693 |
| 2006/0151847 A1* | 7/2006 | Kwon et al. | 257/433 |
| 2007/0085177 A1 | 4/2007 | Loo et al. | |
| 2007/0126131 A1* | 6/2007 | Mueller et al. | 257/787 |
| 2007/0187711 A1* | 8/2007 | Hsiao et al. | 257/100 |
| 2007/0195188 A1* | 8/2007 | Leu et al. | 348/340 |
| 2008/0054460 A1* | 3/2008 | Hung | 257/737 |
| 2008/0188037 A1* | 8/2008 | Lin | 438/108 |
| 2009/0039527 A1* | 2/2009 | Chan et al. | 257/777 |
| 2009/0166873 A1* | 7/2009 | Yang et al. | 257/758 |

OTHER PUBLICATIONS

U.S. Appl. No. 11/846,874, filed Aug. 29, 2007, entitled Interconnect in a Multi-Element Package, first-named inventor Tang, Jinbang, et al.

U.S. Appl. No. 11/831,654, filed Jul. 31, 2007, entitled Redistributed Chip Packaging with Thermal Contact to Device Backside, first-named inventor Tracht, Neil T., et al.

U.S. Appl. No. 11/371,658, filed Mar. 8, 2006, entitled Method for Planarizing Vias Formed in a Substrate, first-named inventor Amrine, Craig, et al.

U.S. Appl. No. 11/561,063, filed Nov. 17, 2006, entitled Method of Packaging a Semiconductor Device and a Prefabricated Connector, first-named inventor Mangrum, Marc A.

U.S. Appl. No. 11/561,234, filed Nov. 17, 2006, entitled Method of Packaging a Device Having a Multi-Contact Elastomer Connector Contact Area and Device Thereof, first-named inventor Mangrum, Marc A.

U.S. Appl. No. 11/561,232, filed Nov. 17, 2006, entitled Method of Packaging a Device Having a Tangible Element and Device Thereof, first-named inventor Mangrum, Marc A.

U.S. Appl. No. 11/561,211, filed Nov. 17, 2006, entitled Method of Packaging a Device Having a Keypad Switch Point, first-named inventor Burch, Kenneth R.

U.S. Appl. No. 11/561,241, filed Nov. 17, 2006, entitled Method of Packaging a Device Using a Dielectric Layer, first-named inventor Mangrum, Marc A.

Rockwell, Ken. "Nikon D40 Specifications". 2006. 13 pages. Printed Oct. 28, 2010 from http://www.kenrockwell.com/nikon/d40/d40-specifications.html.

Topper, Michael. "Wafer Level Packaging: More then IC Packaging". Jul. 1, 2006. Future Fab International. Issue 21. 5 pages. Printed Oct. 28, 2010 from http://www.future-fab.com/documents.asp?d_ID=4028&grID=217.

Jurrien, Ilse. "Foveon X3 DSLR Image Sensor". Sep. 26, 2006. 3 pages. Printed Oct. 28, 2010 from http://www.photokina-show.com/0440/foveon/digitalcameras/foveonx3sensor/.

"Opto-WLP for CMOS Imaging Sensors" 2010. Reed Elsevier Inc. 3 pages. Printed Oct. 28, 2010 from http://www.reedbusinessinformation.com/index.asp?layout=inside&articleId=CA6394968.

* cited by examiner

METHOD OF FORMING A SEMICONDUCTOR PACKAGE INCLUDING TWO DEVICES

BACKGROUND

1. Field

This disclosure relates generally to packaging devices, and more specifically, to packaging at least two devices in one package.

2. Related Art

Customers desire smaller and smarter industrial and consumer electronic products, such as digital cameras, camcorders, and audio players. To decrease size and increase functionality, it is a desirable to include different types of devices in one package. For example, a sensor can be combined with a microcontroller for tire pressure monitoring in an automobile. Such an integrated system can decrease cost and cycle time for development of the end-product. (e.g., the automobile).

Devices, especially sensors, can be packaged in various packages, such as a ceramic leadless chip carrier, a wafer level package, or a quad-flat package (QFP). However, these packages have large package form factors, are expensive or, if used to package a sensor, result in a poor quality sensor.

Hence, a need exists for an improved package that is cost-effective, has a small package form factor and if used to package a sensor, results in a high quality sensor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A process for forming multiple devices, such as a logic device and a sensor, in a package for forming, for example, a system in a package (SiP) is described. In one embodiment, at least one device is placed upside down compared to another device. In other words, one active surface of one device is positioned in an opposite direction than another active surface of another device. In one embodiment, one of the devices is a sensor and its active surface is exposed either visually (e.g., through a transparent layer) or physically outside the package (e.g. active surface of the die is exposed to the environment external of the package).

Figure 1:
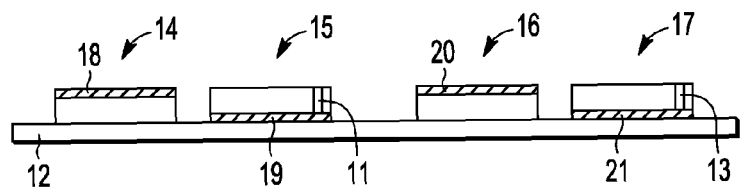
FIGS. 1-8 illustrate a method of forming a package including a sensor and another device in accordance with embodiments of the invention.

FIG. 1 illustrates a cross-section of a portion of a workpiece or panel 10 in accordance with one embodiment. The panel 10, in one embodiment, includes a plurality of aggregated sites of devices, where FIG. 1 illustrates two aggregate sites where each aggregate side includes at least two devices. For example, a first aggregate site includes a first device 14 and a second device 15, and a second aggregate site includes a third device 16 and a fourth device 17. A device may be a semiconductor device, a discrete device, or any other type of device or component. Each aggregate site of panel 10 may be identical to each other or they may have different devices. Furthermore, each aggregate site may include at least two devices, but the devices need not be the same as each other. In one embodiment, at least one device is a sensor device. At some point later in the process, as will be described below, the panel 10 will be singulated such that each aggregated site of the panel 10 will correspond to a single packaged device. Thus, in the illustrated embodiment, one package will include the devices 14 and 15 and another package will include the devices 16 and 17.

Prior to attaching the devices 14-17 to the panel 10, a sacrificial coating, such as tape or photoresist, may be formed on any active surface of the devices 14-17. If the devices 14-17 are die, the sacrificial coating may be formed over the polyimide (or other passivation i.e. TEOS, silicon nitride) layer of the die 14-17 so that the sacrificial coating is the top most (and exposed) layer. If the devices 14-17 are formed in aggregate form, such as die on a wafer, this sacrificial coating may be applied to the devices 14-17 when they are in the aggregate form (i.e., before singulation of a wafer into die.) In one embodiment, the sacrificial coating may be formed only on the devices 14 and 16 because, as will be understood after further explanation, these devices 14 and 16 will have their active surfaces 18 and 20 exposed during a processing step when it may be desirable to protect these surfaces.

The panel 10 includes the first device 14, the second device 15, the third device 16, and the fourth device 17 attached to a carrier or substrate 12. The devices 14-17 are all at the same level. In one embodiment the device 14-17 are all within the same layer, such as the first dielectric material 22. In other words, the lowest surface of the devices 14-17 are all substantially in the same plane and none of the devices 14-17 are substantially higher than another. (A skilled artisan recognizes that the lowest surfaces of the devices may be higher than another due to manufacturability, error, material properties, and the like. Hence, the lowest surfaces are not substantially higher than each other even if they are higher than each other.) The panel 10 may be formed by placing devices that have passed testing requirements, such as electrical, mechanical, or both, (i.e., known good die) over a carrier 12. The carrier 12 may be a transparent material, such as glass or transparent tape or adhesive. In another embodiment, the carrier 12 may be a non-transparent material, such as a ceramic, tape or adhesive. Each of the devices 14-17 has two major surfaces that are opposite each other and horizontal in direction. They also each have four minor surfaces, which are the sides of the devices 14-17. The sides are between the two major surfaces and are perpendicular to the major surfaces. One of the major surfaces is an active surface and the other major surface may be a nonactive surface. Hence, the first device 14 has a first active surface 18, the second device 15 has a second active surface 19, the third device 16 has a third active surface 20, and the fourth semiconductor die 17 has a fourth active surface 21. The active surface is the surface that includes the active circuitry. For devices 14 and 16 the active surfaces 18-21 may include contacts that are coupled to the circuitry either directly or through interconnect vias. For devices 15 and 17 the non-active surfaces may include contacts that are coupled to the circuitry using through-vias 11 and 13.

The first device 14 and the third semiconductor die 16 have their active surfaces 18 and 20 exposed in FIG. 1. In one embodiment, the first device 14 and the third device 16 have their active surfaces 18 and 20 farther from the carrier 12 than their other major surfaces (e.g., the non-active surfaces). In the embodiment, illustrated not only are the active surfaces 18 and 20 farther from the carrier 12 than the other major surfaces, the active surfaces 18 and 20 are also not in contact with the carrier 12. In contrast to the devices 14 and 16 in the embodiment illustrated in FIG. 1, the semiconductor dies 15 and 17 have their active surfaces 19 and 21 in contact with the carrier 12. In other embodiments, the active surfaces 19 and 21 may not be in contact with the carrier 12, but are still closer to the carrier 12 than the semiconductor dies' 15 and 17 other major surfaces (e.g., the nonactive surfaces.) In the embodiment illustrated in FIG. 1 where major surfaces are in contact with the carrier, the carrier 12 may be a tape or adhesive that is capable of having the semiconductor die attach to it without additional material being present. However, in the embodiments where major surfaces are not in contact with the carrier 12, another element, such as a die attach material may be used to attach the devices 14-17 to the carrier 12. This die attach material would be between at least portions of the carrier 12 and the semiconductor dies 14-17. For example, a die attach material may be used if the carrier 12 is a glass.

Figure 2:
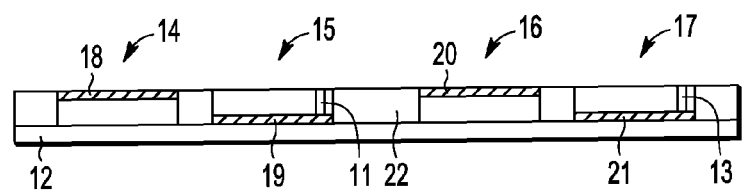

After attaching the devices 14-17 to the carrier 12, a first dielectric material 22 is formed over the panel 10, as shown in FIG. 2. In one embodiment, the first dielectric material 22 is a suitable encapsulant material, such as PC101 from Polysciences of Warrington, Pa. In one embodiment, the first dielectric material 22 is imageable so that portions of it can be exposed through a patterned mask and then removed. In one such embodiment, the first dielectric material 22 is ZTI-1004, from Zeon Technologies of Charlotte, N.C. This material could then be filled with a transparent filler material to allow matching of required mechanical properties. The filler material could also have a refractive index to match the dielectric material and allow transmission of UV radiation for photoimaging. In one embodiment, a metal layer or other material suitable for a mask is formed over the first dielectric material. The metal layer then may be used as a mask to a remove portions of the first dielectric material 22 so that it is coplanar with surfaces of the devices 14-17. With the mask over the workpiece 10, portions of the dielectric material 22 may be removed. If the first dielectric material 22 is photoimageable, portions of it can be removed using light. In other embodiments, portions of the first dielectric material 22 can be dissolved using a chemistry, such as isopropyl alcohol or similar solvent.

In one embodiment, the first dielectric material 22 is deposited. In one embodiment, after forming the first dielectric material 22 over the carrier 12, portions of the first dielectric material 22 are removed, for example, through an etch or polishing process, so that the top of the first dielectric material 22 is substantially coplanar with the top most surface of the devices 14-17 (i.e., one of the major surfaces.) If the devices 14 and 16 include a sacrificial coating over their active surfaces 18 and 20, the sacrificial coating may protect the active surfaces 18 and 20 during the etch or polishing process. If the sacrificial coating is present, it may be removed after such etching, polishing, or other process used to remove portions of the first dielectric material 22, such as those that can be used if the first dielectric material 22 is imageable. If the sacrificial coating is removed after such processing, a skilled artisan recognizes that the top of the devices 14 and 16 are likely to be slightly recessed with respect to the first dielectric material 22. The recess distance will be substantially equal to the thickness of the sacrificial coating. In one embodiment, the sacrificial coating is removed manually if it is has an adhesive that can lose adhesion by selected properties, such as by thermal decomposition or UV irradiation, or by dissolution, using chemistry such as N-methyl 2-pyrrolidone if the coating is chemically similar to photoresists such as AZ4620 from AZ Electronic Materials of Branchburg, N.J.

The first dielectric material 22 is formed between the devices 14-17. As will be appreciated after further discussion, the first dielectric material 22 is a portion of the materials that are used to isolate the first device 14 from the second device 15 and the third device 16 from the fourth device 17 in the resulting packages.

In one embodiment, the carrier 12 is not removed after forming the first dielectric material 22 and as will be understood after further explanation, the carrier 12 is also not removed before conductive regions (e.g., vias and interconnects) are formed. Instead the carrier 12 will remain until the dielectric materials and conductive regions are formed to support and/or protect the devices 14-17.

Figure 3:
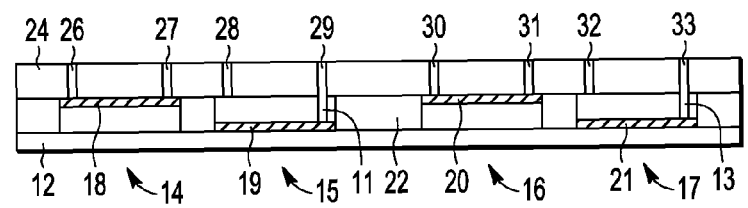

After forming the first dielectric material 22, a second dielectric material 24 is formed over the panel 10, as shown in FIG. 3. In one embodiment, the second dielectric material 24 is the same material as the first dielectric material 22. In another embodiment, the second dielectric material 24 is a different material than the first dielectric material 22. Any suitable material and process used to form the first dielectric material 22 can be used to form the second dielectric material 24. In one embodiment, instead of forming the second dielectric material 24, the first dielectric material 22 separately, they can be formed so that they are formed as one layer that is between the devices 14-17 and over the devices 14-17. In other words, the first dielectric material 22 and the second dielectric material 24 can be the same material formed at the same time and hence, may be the same layer instead of different layers. As will be appreciated after further discussion, the second dielectric material 24 is another portion of the materials that are used to isolate the first device 14 from the second device 15 and the third device 16 from the fourth device 17 in the resulting packages.

After forming the second dielectric material 24 (which may be part of the first dielectric material 22), via-holes, such as vias 26-33 shown in FIG. 3, are formed by patterning and etching the second dielectric material 24 to expose at least a portion of each of the devices 14-17. For the first and third devices 14 and 16 where the active surfaces 18 and 20 will be exposed, the via-holes may expose contacts formed on the active surfaces 18 and 20. For the second and fourth devices, 15 and 17 that via-holes may also expose contacts that are on the non-active side of the devices 15 and 17. In one embodiment, the contacts on the non-active side of the devices 15 and 17 are coupled to the circuitry in the devices 15 and 17 through silicon thru vias (STV) also known as silicon backside vias (SBV). One skilled in the art will recognize that these vias may be formed at the die level prior to integration into the packaging process using a number of different methods including chemical etching, laser drilling, or ion beam drilling.

The via-holes are then filled with any conductive material, such as copper, to form vias 26-33. Therefore, note that vias refer to conductor-filled via-holes. The conductive material can be deposited using any suitable process (e.g., chemical vapor deposition (CVD), atomic layer deposition (ALD), plating, the like, and combinations of the above) to fill the via-holes and form a thick enough material over the first dielectric layer 20 for subsequent interconnects. Vias 26 and 27 are coupled to the first device 14. Vias 28 and 29 are coupled to the second device 15. Vias 30 and 31 are coupled to third devices 16. Vias 32 and 33 are coupled to the fourth device 17.

Figure 4:
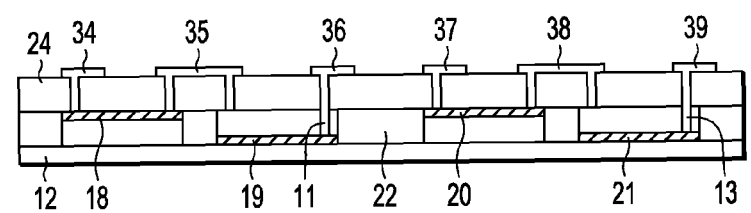

In one embodiment, when filling the vias 26-33 enough conductive material is formed so that it lies outside the vias and over the second dielectric material 24. In this embodiment, the conductive material outside the vias 26-33 may be patterned to form interconnects 34-39, as needed and shown in FIG. 4. In another embodiment, additional metal may be deposited and etched to form the interconnects 34-39 in FIG. 4. The interconnects 34-39 may be any conductive material suitable for the vias 26-33. Interconnects 34-39 and vias 26-33 may couple one of the devices 14-17 to another device 14-17 that will be in the resulting package. For example, interconnect 35 and vias 27 and 28 couple the first device 14 to the second device 15 and interconnect 38 and vias 31 and 32 coupled the third device 16 to the fourth device 17. As will be better understood after further discussion, interconnects 34, 36, 37 and 39 and vias 26, 29, 30 and 33 coupled a device to a subsequently formed terminal, such as a solder ball.

Figure 5:
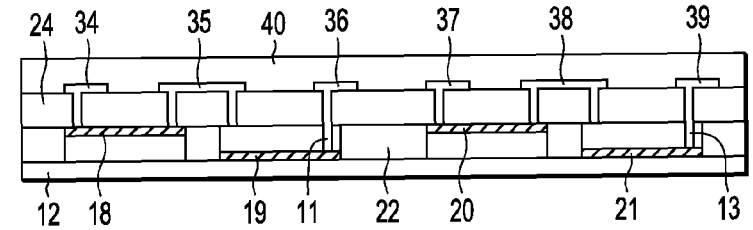

After forming the interconnects 34-39, a third dielectric material 40 is formed over the panel 10, as illustrated in FIG. 5. In one embodiment, the third dielectric material 40 is the same material as the first dielectric material 22, the second dielectric material 24, or both. In another embodiment, the third dielectric material 40 is a different material than the first dielectric material 22, the second dielectric material 24, or both. Any suitable material and process used to form the first dielectric material 22 or the second dielectric material 24 can be used to form the third dielectric material 40. As will be appreciated after further discussion, the third dielectric material 40 is yet another portion of the materials that are used to isolate the first device 14 from the second device 15 and the third device 16 from the fourth device 17 in the resulting packages.

Figure 6:
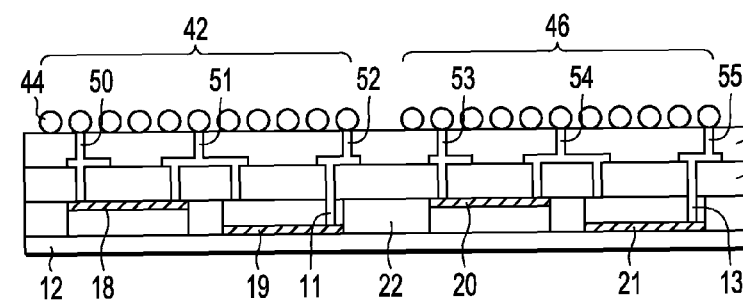

After forming the third dielectric material 40, vias 50-55 and a plurality of electrical contacts or terminals 42 and 46 are attached, as illustrated in FIG. 6. The vias 50-55 can be formed using the same methods and material as the vias 26-33. However, different methods and materials can be used. After forming the vias 50-55, the first plurality of electrical contacts 42, which includes for example electrical contact 44, is attached to the aggregated package sites of panel 10. In the embodiment illustrated, the plurality of electrical contacts are solder balls. Any desirable solder ball material may be used, such as lead-tin or a lead-free material. The solder balls can be attached using conventional processes, such as applying a solder paste and performing a reflow process to melt the solder paste and physically adhere the solder balls to the aggregated package sites of panel 10. Although terminal 44 (and others) do not appear in the cross-section to be coupled to the first or second devices 13 and 15, the terminal 44 is coupled to either one or both of the devices 13 and 15 through vias and interconnects not viewable in the cross-sectional illustration of FIG. 6. In addition, for each resulting package a plurality of electrical contacts 42 and 46 is attached. Hence, the plurality of electrical contacts 42 are the electrically conductive contacts for the resulting package that includes the first and second devices 14 and 15 and the plurality of electrical contacts 46 are the electrically conductive contacts for the resulting package that includes the third and fourth devices 16 and 17.

Figure 7:
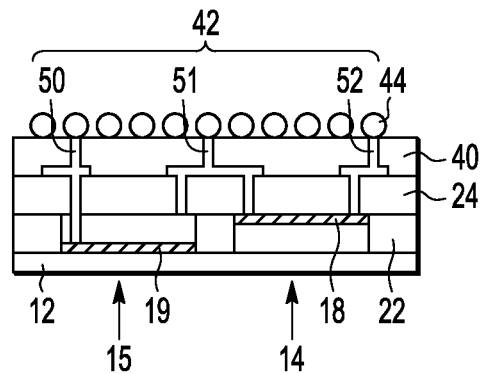

After forming the plurality of electrical contacts 42-46, the panel 10 may be singulated to form multiple packaged devices. Singulation can be performed, for example, using a saw or a laser. In the embodiments illustrated in FIGS. 1-6, two packages are formed as a result of singulation. The first package includes devices 14 and 15, as illustrated in FIG. 7. The second package, which is not illustrated, includes devices 16 and 17.

Figure 8:
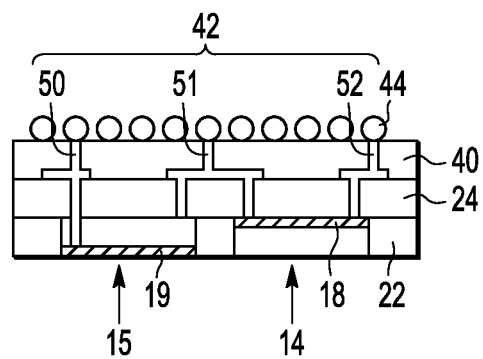

After singulation, if desired, the carrier 12 or portions of the carrier 12 can be removed. In the embodiment illustrated in FIG. 8, the entire carrier 12 is removed. The carrier 12 or portions of the carrier can be removed using any process, such as heat (e.g., UV light), a solvent, the like or combinations of the above, especially if the carrier 12 is an adhesive. The determination of whether or not to remove the carrier 12 will depend on the material used for the carrier 12 and the function of the device 15, which may be a sensor. The device or sensor 15 can be an optical sensor or a microelectromechanical sensor (MEMS), such as a gas sensor, accelerometer, barometric sensor, and altimeter. In the embodiment where the sensor 15 is an optical sensor the carrier 12 is not transparent, at least a portion of the carrier 12 is removed at some point before use in the predetermined end-product so that the active surface 19 of the sensor 15 can receive the optical input. Likewise, in the embodiment where the sensor 15 is a gas sensor at least a portion of the carrier 12 will be removed so that the gas can reach the sensor 15. In this embodiment, the carrier 12 may be patterned at any time in the process (e.g., even before the devices are attached to the carrier 12).

Figure 9:
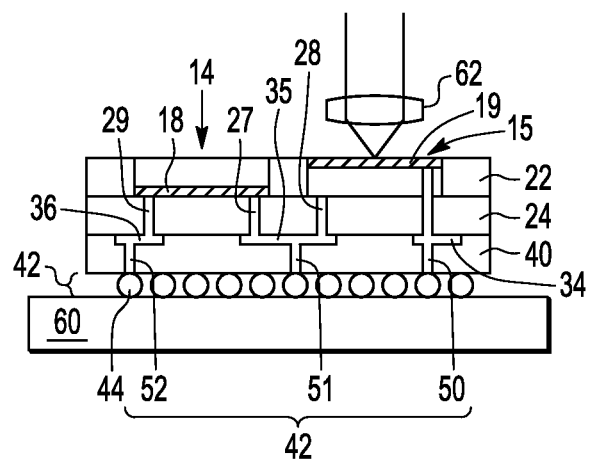
FIG. 9 illustrates one embodiment of using the package forming in FIGS. 1-8.

The carrier 12 or portions thereof may be removed by a semiconductor manufacturer after singulation according to one embodiment. In another embodiment, the semiconductor manufacturer may ship the package device to a customer with the carrier 12 to protect the sensor 15. The customer may then remove the carrier 12 or portions thereof. In addition, the customer (or another entity which could be the semiconductor manufacturer) may continue further processing if desired. For example, after removing the carrier 12 or portions thereof, the package 10 may be flipped over so that the active surface 19 of the sensor 15 is on the top of the package and at least a portion thereof is exposed. Afterwards, the carrier 12 may be attached to another carrier or substrate 60, such as a printed circuit board (PCB). Furthermore, in some embodiment, such as this one where the sensor 15 is a gas sensor additional structures may be added. For example, if the sensor 15 is a gas sensor an internal or external fan may be added to move the gas across the active surface 19 of the device 15. In addition, a funnel with a grate may be used to protect the gas sensor. In the embodiment illustrated in FIG. 9, the device 15 is an optical sensor, and an external lens 62 may be added to focus the light for the optical sensor 15.

A skilled artisan recognizes that the embodiments described are merely illustrative and various modifications can be made. For example, the interconnects and vias as illustrated in the figures are merely examples of the interconnects and vias that can be formed. Any number or suitable type of vias and interconnects can be used. In addition, any number of layers of dielectric material, conductive vias, and interconnects may be used. In addition, the layers of dielectric material, interconnects, etc. are illustrated only on one side of the carrier 12, but a skilled artisan understands that similar layers, interconnects, etc. can formed on the other side of the carrier 12 so that such layers, interconnects, etc. are on both sides of the carrier 12, or placed on a second side of panel after carrier is removed, as discussed above.

Below are descriptions of some embodiments: 1. A semiconductor package comprising: a first device at a first level in the semiconductor package, wherein the first device includes a first active surface positioned in a first direction; and a second device at the first level, wherein: the second device includes a second active surface in a second direction; and the first direction is opposite the second direction. 2. The semiconductor package of item 1, wherein at least a portion of the second active surface is exposed outside the semiconductor package. 3. The semiconductor package of items 1 or 2, wherein a portion of the second active surface is visually exposed. 4. The semiconductor package of items, 1, 2, or 3, further comprising a transparent layer in contact with the portion of the second active surface. 5. The semiconductor package of items 1, 2, 3, or 4 wherein the portion of the second active surface is physically exposed. 6. The semiconductor package of item 1, 2, 3, 4, or 5, wherein the second device comprises a sensor. 7. The semiconductor package of items 1, 2, 3, 4, 5, 6, or 7, wherein the second device comprises an active display. 8. The semiconductor package of items 1, 2, 3, 4, 5, 6, or 7, wherein the second device comprises a microelectromechanical device. 9. The semiconductor package of items 1, 2, 3, 4, 5, 6, 7, or 8, wherein the second device comprises a microelectromechanical device selected from the group consisting of a barometric sensor, a gas sensor, and an accelerometer. 10. The semiconductor package of items 1, 2, 3, 4, 5, 6, 7, 8, or 9, wherein the first active surface and the second active surface are parallel to each other and horizontal.

11. A method of forming a semiconductor package, the method comprising: providing a carrier; attaching a first surface of a first device on the carrier, wherein the first surface comprises a first active surface of the first device; attaching a second surface of a second device on the carrier, wherein: the second surface is opposite a third surface of the second device; and the third surface comprises a second active surface; forming a first insulating material between the first device and the second device; forming a second insulating material over the first device and the second device; forming a first via and a second via in the second insulating material, wherein: the first via is electrically coupled to the first device; and the second via is electrically coupled to the second device; electrically coupling a first terminal to the first via; and electrically coupling a second terminal to the second via. 12. The method of item 11, further comprising, removing at least a portion of the carrier to expose at least a portion of the first active surface. 13. The method of item 12, wherein removing at least the portion of the carrier comprises removing all of the carrier. 14. The method of item 12, wherein removing comprises etching. 15. The method of item 12, where removing comprises using one of a group selected from light and heat. 16. The method of item 12, wherein removing occurs after electrically coupling the first terminal to the first via. 17. The method of items 11, 12, 13, 14, 15, or 16, wherein the carrier is selected from a group consisting of: glass and tape. 18. The method of items 11, 12, 13, 14, 15, 16, or 17, wherein after attaching the first and second surfaces the second surface is in a same horizontal plane as the first surface. 19. The method of items 11, 12, 13, 14, 15, 16, 17, or 18 wherein the first terminal and the second terminal comprise solder balls.

20. A method of forming a semiconductor package, the method comprising: providing a carrier; attaching a first surface of a first device on the carrier, wherein the first surface comprises a first active surface of the first device; attaching a second surface of a second device on the carrier, wherein: the second surface is opposite a third surface of the second device; and the third surface comprises a second active surface; and forming a first insulating material between the first device and the second device.

By now it should be appreciated that there has been provided a method and structure for integrating multiple devices into a package that is economically feasible, and can include embedded opto-electric devices, peripheral components and multiple active components. The method includes using a buildup process. The package includes devices that are mounted in multiple orientations (e.g., up and down, top and bottom, etc.) The mounting can be simultaneous so that it occurs in one step (or process) or occurring immediately after each other so that there is no intervening step (or process). In some embodiments, the devices are integrated into the same package and through-vias are used to access the circuitry on at least one of the devices. Since at least one of the major surfaces of at least one of the devices may be exposed the other major surface may be embedded within the package, such as within a dielectric material.

Mobile communication customers may want to use these packages to build small devices such as a wrist-watch cell phone and eyeglass mounted heads up displays. The package can also be used in applications that require secure, high-speed data transmission within a package. In these embodiments, optical fibers can be added for device-to-device interconnect and device-to-external ports interconnect.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, the package may include any number of devices. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A method comprising:
providing a carrier;
providing a first device having a first major surface and a second major surface, the first major surface comprising an active surface including a sensor, an active display, or a microelectromechanical device;
providing a second device having a first major surface and a second major surface, the first major surface comprising an active surface;
attaching the first major surface of the first device to the carrier;

attaching the second major surface of the second device to the carrier, the first major surface of the first device coplanar with the second major surface of the second device;

forming a first through-via extending from the second major surface of the first device towards the first major surface of the first device and electrically coupled to circuitry of the active surface of the first device;

forming a first insulating material between minor surfaces of the first device and the second device;

forming a second insulating material over the entirety of the first device and the second device;

forming a first via in the second insulating material, the first via electrically coupled to the first through-via;

forming a second via in the second insulating material, the second via electrically coupled to circuitry at the active surface of the second device;

electrically coupling a first terminal to the first via;

electrically coupling a second terminal to the second via; and removing at least a portion of the carrier to expose at least a portion of the active surface of the first device.

2. The method of claim 1, wherein removing comprises etching.

3. The method of claim 1, where removing comprises using light or heat.

4. The method of claim 1, wherein removing occurs after electrically coupling the first terminal to the first via.

5. The method of claim 1, wherein the carrier is selected from a group consisting of: glass and tape.

6. The method of claim 1, wherein the first terminal and the second terminal comprise solder balls.

7. The method of claim 1, wherein in a finished semiconductor package, the active surface of the second device is not exposed.

8. The method of claim 1, wherein the first insulating material is in direct contact with the first and second devices.

9. The method of claim 1, further comprising:
forming a second through-via extending from the second major surface of the first device towards the first major surface of the first device and electrically coupled to circuitry of the active surface of the first device;
forming a third via in the second insulating material, the third via electrically coupled to the second through-via;
forming a fourth via in the second insulating material, the fourth via electrically coupled to circuitry at the active surface of the second device; and
electrically coupling the third and fourth vias to each other.

10. A method comprising:
providing a carrier;
providing a first device having a first major surface and a second major surface, the first major surface comprising an active surface including a sensor, an active display, or a microelectromechanical device;
providing a second device having a first major surface and a second major surface, the first major surface comprising an active surface;
attaching the first major surface of the first device to the carrier;
attaching the second major surface of the second device to the carrier, the first major surface of the first device coplanar with the second major surface of the second device;
forming a sacrificial layer over the active surface of the second device to protect the active surface during a subsequent processing step;
forming a first insulating material between minor surfaces of the first device and the second device;
forming a second insulating material over the entirety of the first device and the second device;
forming a first via in the second insulating material, the first via electrically coupled to a contact at the second major surface of the first device, the contact electrically coupled to circuitry at the active surface of the first device by a first through-via extending from the second major surface of the first device towards the first major surface of the first device, the first through via formed at the first device prior to attaching the first device to the carrier;
forming a second via in the insulating material, the second via electrically coupled to circuitry at the active surface of the second device;
electrically coupling a first terminal to the first via;
electrically coupling a second terminal to the second via; and
removing at least a portion of the carrier to expose at least a portion of the active surface of the first device.

11. The method of claim 10, wherein the active surface of the second device is not exposed.

12. The method of claim 10, further comprising disposing a lens adjacent and optically coupled to the active surface of the first device.

13. The method of claim 10, wherein the first insulating material is in direct contact with the first and second devices.

14. The method of claim 10, wherein the first device is of a different type as compared to the second device.

15. The method of claim 10, further comprising:
forming a third via in the second insulating material, the third via electrically coupled to circuitry at the active surface of the first device by a second through-via; and
forming a fourth via in the insulating material, the fourth via electrically coupled to circuitry at the active surface of the second device, wherein the third via is electrically coupled to the fourth via.

16. The method of claim 10, wherein the entire carrier is removed.

17. The method of claim 10, wherein the portion of the carrier that is removed is removed by etching.

18. The method of claim 10, wherein the portion of the carrier that is removed is removed using light or heat.

19. The method of claim 10, wherein the portion of the carrier that is removed is removed after electrically coupling the first terminal to the first via.

20. The method of claim 10, wherein the carrier is selected from a group consisting of: glass and tape.

21. The method of claim 10, wherein the first terminal and the second terminal comprise solder balls.

* * * * *